United States Patent
Pareek et al.

(10) Patent No.: US 10,233,554 B2
(45) Date of Patent: Mar. 19, 2019

(54) ALUMINUM ELECTROPLATING AND OXIDE FORMATION AS BARRIER LAYER FOR ALUMINUM SEMICONDUCTOR PROCESS EQUIPMENT

(71) Applicant: Applied Materials, Inc., Santa Clara, CA (US)

(72) Inventors: Yogita Pareek, Sunnyvale, CA (US); Laksheswar Kalita, Mumbai (IN); Geetika Bajaj, New Delhi (IN); Kevin A. Papke, San Jose, CA (US); Ankur Kadam, Mumbai (IN); Bipin Thakur, Mumbai (IN); Yixing Lin, Saratoga, CA (US); Dmitry Lubomirsky, Cupertino, CA (US); Prerna S. Goradia, Mumbai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 34 days.

(21) Appl. No.: 15/452,062

(22) Filed: Mar. 7, 2017

(65) Prior Publication Data
US 2017/0260639 A1  Sep. 14, 2017

Related U.S. Application Data

(60) Provisional application No. 62/336,111, filed on May 13, 2016, provisional application No. 62/307,147, filed on Mar. 11, 2016.

(51) Int. Cl.
*C25D 3/44* (2006.01)
*C25D 3/66* (2006.01)
(Continued)

(52) U.S. Cl.
CPC ............ *C25D 3/44* (2013.01); *C25D 5/18* (2013.01); *C25D 5/48* (2013.01); *C25D 5/50* (2013.01);
(Continued)

(58) Field of Classification Search
CPC ... C25D 5/48; C25D 5/50; C25D 3/66; C25D 3/665
(Continued)

(56) References Cited

U.S. PATENT DOCUMENTS

| | | | |
|---|---|---|---|
| 4,071,526 A | 1/1978 | Dotzer et al. | |
| 5,158,663 A | 10/1992 | Yahalom | |

(Continued)

FOREIGN PATENT DOCUMENTS

| | | |
|---|---|---|
| JP | 2011-084798 A | 4/2011 |
| WO | 99/40241 A2 | 8/1999 |
| WO | 2012/043129 A1 | 4/2012 |

OTHER PUBLICATIONS

International Search Report and Written Opinion dated Jun. 1, 2017 for Application No. PCT/US2017/019477.
(Continued)

*Primary Examiner* — Brian W Cohen
(74) *Attorney, Agent, or Firm* — Patteron + Sheridan LLP

(57) ABSTRACT

The present disclosure generally relates to methods of electro-chemically forming aluminum or aluminum oxide. The methods may include the optional preparation of a an electrochemical bath, the electrodepositon of aluminum or aluminum oxide onto a substrate, removal of solvent form the surface of the substrate, and post treatment of the substrate having the electrodeposited aluminum or aluminum oxide thereon.

19 Claims, 3 Drawing Sheets

(51) Int. Cl.
  *C25D 5/18* (2006.01)
  *C25D 5/48* (2006.01)
  *C25D 5/50* (2006.01)
  *C25D 11/04* (2006.01)
  *H01L 21/67* (2006.01)
  *C25D 5/02* (2006.01)

(52) U.S. Cl.
  CPC ........ C25D 11/04 (2013.01); H01L 21/67023 (2013.01); *C25D 3/66* (2013.01); *C25D 5/022* (2013.01)

(58) Field of Classification Search
  USPC .......................................... 205/237, 220, 224
  See application file for complete search history.

(56) References Cited

U.S. PATENT DOCUMENTS

| | | | | |
|---|---|---|---|---|
| 6,027,629 | A * | 2/2000 | Hisamoto | B01J 3/006 |
| | | | | 205/172 |
| 2002/0081394 | A1* | 6/2002 | Joo | C23C 16/403 |
| | | | | 427/569 |
| 2004/0137147 | A1 | 7/2004 | O'Donnell et al. | |
| 2008/0017516 | A1 | 1/2008 | Han et al. | |
| 2010/0112378 | A1 | 5/2010 | Deininger et al. | |
| 2012/0138472 | A1 | 6/2012 | Han et al. | |
| 2012/0144640 | A1 | 6/2012 | Shih et al. | |
| 2013/0168258 | A1 | 7/2013 | Nakano et al. | |
| 2013/0341197 | A1* | 12/2013 | Piascik | C25D 5/12 |
| | | | | 205/176 |
| 2015/0064450 | A1* | 3/2015 | Sun | C25D 5/44 |
| | | | | 428/335 |
| 2015/0275375 | A1 | 10/2015 | Kim et al. | |
| 2015/0292098 | A1* | 10/2015 | Benaben | C25D 3/10 |
| | | | | 205/262 |
| 2016/0108534 | A1* | 4/2016 | Dai | C25D 5/02 |
| | | | | 205/117 |

OTHER PUBLICATIONS

International Search Report and Written Opinion dated May 30, 2017 for Application No. PCT/US2017/017817.

* cited by examiner

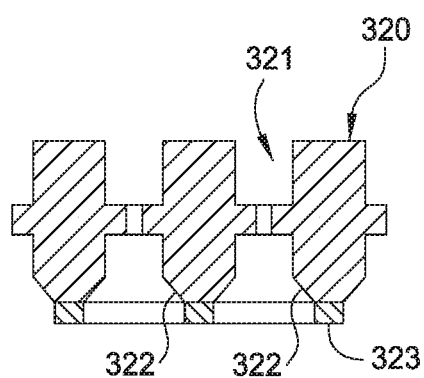
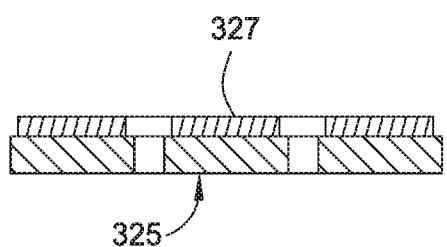
FIG. 3A  FIG. 3B
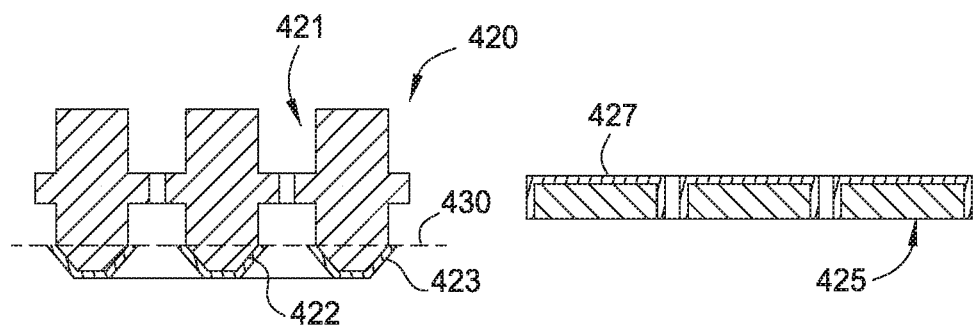
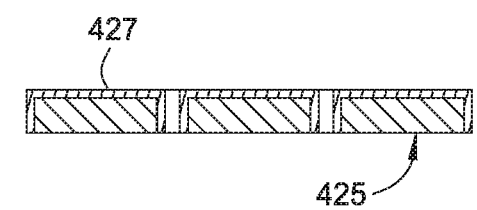
FIG. 4A  FIG. 4B

ALUMINUM ELECTROPLATING AND OXIDE FORMATION AS BARRIER LAYER FOR ALUMINUM SEMICONDUCTOR PROCESS EQUIPMENT

CROSS-REFERENCE TO RELATED APPLICATIONS

This application claims benefit of U.S. provisional patent application Ser. No. 62/336,111 filed May 13, 2016, and U.S. provisional patent application Ser. No. 62/307,147 filed Mar. 11, 2016, each of which is herein incorporated by reference.

BACKGROUND

Field

Implementations of the present disclosure generally relate to forming protective layers on mechanical components, and more particularly, to electro-chemically forming coatings such as aluminum or aluminum oxide on semiconductor processing equipment.

Description of the Related Art

Conventionally, semiconductor processing equipment surfaces include certain coatings thereon to provide a degree of protection from the corrosive processing environment or to promote surface protection of the equipment. Several conventional methods utilized to coat the protective layer include physical vapor deposition (PVD), chemical vapor deposition (CVD), plasma spraying, aerosol deposition, and the like. However, these conventional methods are unable to satisfactorily coat semiconductor equipment, especially in areas having small holes or plenums, such as showerheads. Some other techniques such as anodization of the substrate and PEO coatings can form a barrier layer inside the holes, however, these barrier layers include inherent porosity. The porosity of these layers can trap halides therein, and release the halides during processing thus causing undesired contamination.

Therefore, there is a need for improved deposition methods for protective coatings.

SUMMARY

In one implementation, a method of depositing a material on a substrate comprises positioning an aluminum substrate in an electroplating bath, the electroplating batch comprising a non-aqueous solvent and a deposition precursor, depositing a coating on the aluminum substrate, the coating comprising aluminum or aluminum oxide, removing excess plating solution form the aluminum substrate, and post-treating the aluminum substrate having the coating thereon.

In another implementation, a method of depositing a material on a substrate comprises positioning an aluminum substrate having one or more plenums formed therein in an electroplating bath, the electroplating batch comprising a non-aqueous solvent and a deposition precursor, the deposition precursor comprising $AlCl_3$ or $Al(NO_3)_3$, depositing a coating on the aluminum substrate, the coating comprising aluminum or aluminum oxide, removing excess plating solution form the aluminum substrate, wherein the removing comprising evaporating the excess plating solution, and post-treating the aluminum substrate having the coating thereon.

In another implementation, a method of depositing a material on a substrate comprises positioning an aluminum substrate having one or more plenums formed therein in an electroplating bath, the electroplating bath comprising a non-aqueous solvent, a deposition precursor, and sulphonamide, depositing a coating on the aluminum substrate, the coating comprising aluminum or aluminum oxide; removing excess plating solution form the aluminum substrate, and post-treating the aluminum substrate having the coating thereon.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and the disclosure may admit to other equally effective implementations.

FIGS. 3A and 3B respectively illustrate partial sectional views of a showerhead and a faceplate coated using conventional methods.

FIGS. 4A and 4B respectively illustrate partial sectional views of a showerhead and a faceplate coated using methods described herein.

Figure 1:
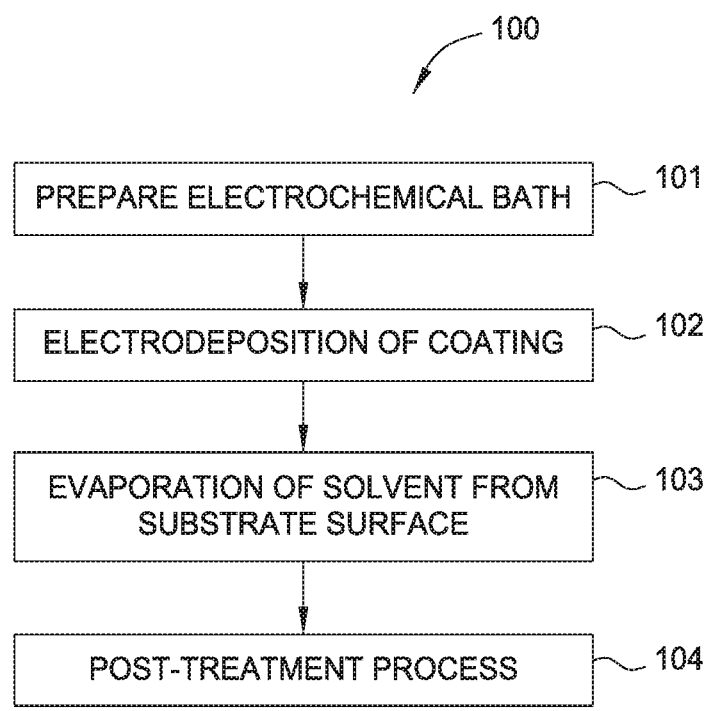
FIG. 1 illustrates a flow diagram of a method for electrodepositing aluminum or aluminum oxide on a substrate, according to one implementation of the disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The present disclosure generally relates to methods of electro-chemically forming aluminum or aluminum oxide. The methods may include the optional preparation of a an electrochemical bath, the electrodepositon of aluminum or aluminum oxide onto a substrate, removal of solvent form the surface of the substrate, and post treatment of the substrate having the electrodeposited aluminum or aluminum oxide thereon.

Figure 2:
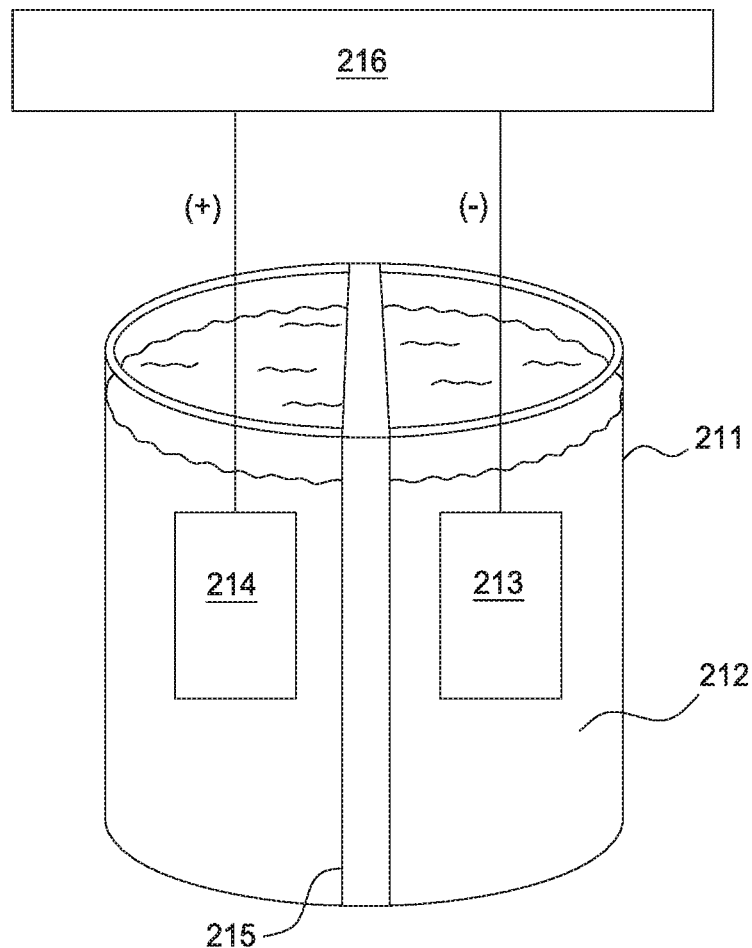
FIG. 2 illustrates an electrochemical bath, according to one implementation of the disclosure.

FIG. 1 illustrates a flow diagram of a method 100 for electrodepositing aluminum or aluminum oxide on a substrate, according to one implementation of the disclosure. FIG. 2 illustrates an electrochemical bath, according to one implementation of the disclosure. FIGS. 1 and 2 will be explained in conjunction to facilitate explanation of aspects of the disclosure.

The method 100 begins at operation 101. In operation 101, an electrochemical bath 210 is prepared. The electrochemical bath 210 includes a container 211 having a solution 212 disposed therein. The solution 212 may include one or more of a solvent, an electrolyte or other deposition precursor, and plating additives. An anode 213 and a substrate 214, which functions as a cathode, are positioned in the solution 212 and may be separated by a divider 215, such as a porous membrane, for example, a perforated PVDF sheet, to reduce the likelihood of physical contact between the anode 213 and the substrate 214. The anode 213 and the substrate 214 are coupled to a power supply 216, such as a constant DC power supply or pulsed DC power supply to facilitate plating of material onto the substrate 214.

In one example, the substrate 214 is semiconductor processing equipment. Examples of semiconductor processing equipment include components formed from aluminum or aluminum alloys, such as showerheads or gas distributors, or other equipment which may have a plurality of gas passages formed therein. Examples of aluminum alloys include Al6061 and Al6063, among other alloys. It is contemplated that substrates without gas passages formed therein may also be subjected to plating. In one example, the anode 213 may also be formed from aluminum, such as Al6061 aluminum alloy.

The solution may 212 may include one or more aqueous solvents such as water, or non-aqueous solvents such as dry acetonitrile, ethanol, toluene, or isopropyl alcohol or mixtures of two solvents in a ratio of about 1:20 to about 1:5, such as about 1:2 or about 1:3 or about 1:4 or about 1:5 ratio. One or more plating precursors, such as $AlCl_3$, $Al(NO_3)_3$, aluminum alkoxide or alkyl aluminum may be dissolved in the solution 212. The one or more plating precursors may be dissolved in the solution at a concentration of about 0.001 Molar (M) to about 2M, such as about 0.1M to about 1M, for example, about 0.5M to about 1M. One or more additives, such as potassium nitrate ($KNO_3$), sodium fluoride, sodium acetate or sulphonamide may be added to the solution 212 to improve characteristics of the plated material. For example, the additives may be selected to improve planarity of the deposited coating, adjust composition of deposited coating, or to reduce roughness or cracking of the plated coating. Additives may also be selected to improve the conductivity of the solution 212, thereby increasing deposition rate of the plated material and improving deposition uniformity. The one or more additives may be present in the solution 212 at a concentration of 0.001 Molar (M) to about 1M, such as about 0.1M to about 0.5M, for example, about 0.1M to about 0.3M. The substrate 214 may be positioned in the solution 212 after preparation thereof.

In operation 102, a material, such as aluminum or aluminum oxide, is electrodeposited on the substrate 214. The anode 213 is negatively biased by the power supply 216, while the substrate 214 is positively biased by the power supply 216. Bias of the anode 213 and the substrate 214 facilities plating of desired materials, such as aluminum or aluminum oxide from the solution 212 on to the substrate 214. The anode 213 and the substrate 214 may be biased with a voltage in the range of about 1 volt to about 300 volts or 1 volt to about 100 volts, such as about 1 volt to about 50 volts, or about 1 volt to about 10 volts. In one example, the anode 213 and substrate 214 may be biased with a voltage within a range of about 1 volt to about 10 volts when using an Aluminum deposition precursor, due to the ability of Aluminum deposition precursors to facilitate deposition of aluminum at relatively low voltages. The anode 213 and the substrate 214 may be biased with a current in the range of about −0.1 miliampere (mA) to about −2 ampere, such as about −0.1 mA to about −50 mA, or about −0.1 mA to about −10 mA.

The solution 212 may be maintained at a temperature within a range of about 0 degrees Celsius to about 100 degrees Celsius during operation 102. In one example, the solution may be maintained at a temperature of about 23 degrees Celsius to about 50 degrees Celsius, such as about 25 degrees Celsius. The bias voltages of operation 102 may be applied for a time period of about 3 hours or less, for examples, about 5 minutes to about 60 minutes, such as about 10 minutes to about 30 minutes.

Additionally or alternatively, the use of pulse deposition techniques, where the potential or current is altered rapidly between two different values, is contemplated. The rapid alternation results in a series of pulses of equal amplitude, duration, and polarity, separated by zero current. Each pulse consists of an ON time ($T_{ON}$) and OFF time ($T_{OFF}$). During $T_{OFF}$, ions migrate to the depleted areas in the bath. During $T_{ON}$, more evenly-distributed ions are available for deposition onto the substrate 214. In one example, $T_{ON}$ may be about 0.001 seconds to 60 seconds, and $T_{OFF}$ time may be about 0.001 seconds to 60 seconds.

It is contemplated that characteristics of operations 101 and 102 may be varied to achieve a desired thickness or composition of the plated material. For example, it is contemplated that the concentration of the plating precursor, the duration of the bias voltage, or the magnitude of the bias voltage may be increased in order to increase the deposition rate or the thickness of the plated material. In one example, the plated material, such as aluminum, may be deposited to a thickness of 100 micrometers or less, such as about 2 micrometers to about 50 micrometers, such as about 10 micrometers to about 20 micrometers.

Subsequently, in operation 103, the substrate 214 is removed from the solution 212, and excess solution 212 is removed from the surface of the substrate 214. Excess solution 212 may be removed, for example, via evaporation or drying. One or more of dryer, heat source, light source, or a fan may facilitate the removal of the excess solution 212 from the substrate 214. Optionally, operation 103 may be omitted.

In one plating example, the electrochemical deposition of aluminum on the substrate 214 proceeds as follows:
Cathode:

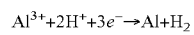

Anode:

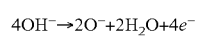

In operation 104, after evaporation of the excess solution 212, the substrate 214 may be subjected to a post treatment process. In one example, the post treatment process of operation 104 is an annealing process. In such an example, the substrate 214 may be annealed at a temperature of about 50 degrees Celsius to about 300 degrees Celsius. The anneal temperature may be selected to facilitate removal of hydroxyl moieties from the surface of the substrate 214 during the post treatment process. In another implementation, the post treatment process may be an oxidizing process. In such an example, the substrate 214 may be exposed to an oxygen-containing environment to facilitate oxidation of the plated material on the substrate 214. For example, the substrate may be exposed to oxygen, ozone, or ionized oxygen or oxygen-containing gas. The oxidation of the plated material may be facilitated through the use of plasma or thermal processing. The annealing process of operation 104 may also increase adhesion of the plated material to the underlying substrate 214.

In another example, the post-treatment process may be a second bath. In the second bath, the substrate 214 may be anodized using neutral electrolytes at about 10 volts to about 200 volts to form an oxide layer on an outer surface of the plated coating. In another implementation, the posttreatment process may include exposing the substrate to nitric acid to oxidize the upper surface of the deposited coating. The nitric acid bath may include about 20% to about 69% nitric acid, and may be at a temperature of about 0 degrees Celsius to about 25 degrees Celsius. It is contemplated that temperatures below room temperature increase the density of the anodized layer compared to a similar nitric acid anodization process which occurs at room temperature or greater. In one example, the oxidized portion of the plated coating may have a thickness of about 200 nanometers or less, such as about 100 nanometers or less, such as about 5 nanometers or less. In one example, about 5 percent of the plated aluminum layer may be anodized.

In one example, a coating is deposited on an aluminum substrate according to method 100. In the example, an aluminum substrate is positioned in an electroplating bath using ethanol as a solvent and having a deposition precursor dissolved therein at a concentration of 0.1 M. The bath is maintained at a temperature of 10 degrees Celsius, and a bias of 10 volts is applied for 30 minutes. The electroplated film has thickness of about 100 nanometers, and an upper portion of anodized aluminum having a thickness of about 5 nanometers. The anodization of plated aluminum results in a denser aluminum oxide layer than other anodization methods, particularly anodization of aluminum alloys. In one example, the anodized plated aluminum has a density within a range of about 2.0-3.0 grams per cubic centimeter, such as about 2.3-2.8 grams per cubic centimeters, for example 2.5 grams per cubic centimeter.

FIGS. 3A and 3B respectively illustrate partial sectional views of a showerhead 320 and a faceplate 325 coated using conventional methods, such as thermal spraying ore-beam deposition. As shown in FIG. 3A, a showerhead 320 is formed from aluminum and includes a plurality of plenums 321 formed therein (two are shown). The plenums 321 may optionally include beveled edges 322 at one end thereof. Using conventional coating techniques, the beveled edges 322 are not coated with a protective coating 323 due to limitations of conventional coating techniques. For example, conventional techniques are unable to adequately coat substrates near plenums due to the directional deposition nature of conventional techniques. Conventional techniques thus leave the beveled edges 322 exposed, thereby contributing to contamination in the presence of plasma via reaction of the uncoated surfaces with the plasma. The unprotected surfaces which are exposed to plasma are easily degraded, thus introducing undesired particulate matter to the process region, and as a consequence, reducing device quality.

FIG. 3B illustrates a faceplate 325 including plenums 326 having a protective coating 327 deposited thereon. Similar to the showerhead 320 described, conventional techniques are unable to adequately coat the faceplate 325, particularly the plenums 326. While upper surfaces of the faceplate 325, which are generally adjacent a deposition source during deposition of the protective coating 327, may be coated, the interior surfaces of the plenums 326 remain uncoated. The uncoated surfaces contribute to contamination within a process chamber due to undesired interaction with processing plasmas.

FIGS. 4A and 4B respectively illustrate partial sectional views of a showerhead 420 and a faceplate 425 coated using methods described herein. The electroplating methods described herein result in improved plating of mechanical components, particularly those including orifices, holes, plenums, and the like. Referring to FIG. 4A, the showerhead 420 includes improved coating coverage of bevels 422 of plenums 421 compared to conventional approaches. Using methods described herein, electroplating results in complete and uniform deposition of respective coatings 423, 427 over all surfaces submerged in a plating bath. The submerged portions of the showerhead 420 are indicated by the line 430. However, it is to be understood that the entire showerhead 420 may be submerged in a plating bath. In such an implementation, areas of undesired deposition may be masked to prevent plating.

Benefits of the disclosure include more complete deposition of material on components. In contrast to conventional deposition techniques, the electroplating methods disclosed herein result in improved plating near orifices, plenums, or other small features of a substrate. The more complete coverage results in increased protection of the component, particularly in plasma environments often used in the processing of semiconductor materials.

Additionally, the anodized layers formed herein are more dense (e.g., less porous) than conventional anodized layers and anodized layers formed from aluminum alloys, thus providing better corrosion resistance, particularly to plasmas. In some examples, anodized layers of the present disclosure are subjected to a bath of 5 percent HCl in a bubble test. The anodized layer showed HCl bubble test resistance for about 20-47 hours. In contrast, conventional anodized layers show HCl bubble test resistance for about 5 hours.

While the foregoing is directed to implementations of the present disclosure, other and further implementations of the disclosure may be devised without departing from the basic scope thereof, and the scope thereof is determined by the claims that follow.

What is claimed is:

1. A method of depositing a material on a substrate, comprising:
    positioning an aluminum substrate in a container comprising an anode, an electroplating bath, and a divider separating the anode and the aluminum substrate, the divider comprising a perforated PVDF sheet, the electroplating bath comprising a non-aqueous solvent and a deposition precursor, wherein the deposition precursor comprises $Al(NO_3)_3$;
    depositing a coating on the aluminum substrate, the coating comprising aluminum or aluminum oxide;
    removing excess plating solution form the aluminum substrate; and
    post-treating the aluminum substrate having the coating thereon.

2. The method of claim 1, wherein the aluminum substrate comprises an aluminum alloy selected from the group consisting of Al6061 alloy and Al6063 alloy, and the anode comprises a Al6061 alloy.

3. The method of claim 1, wherein the electroplating bath comprises the non-aqueous solvent and a second solvent in a ratio from 1:2 to 1:5.

4. The method of claim 1, wherein the deposition precursor has a concentration within a range of about 0.1M to about 1M.

5. The method of claim 1, wherein the deposition precursor has a concentration within a range of about 0.5M to about 1M.

6. The method of claim 1, wherein the electroplating bath further comprises potassium nitrate, sodium fluoride, or sodium acetate.

7. The method of claim 1, wherein the depositing a coating comprises pulsing a current on and off.

8. The method of claim 7, wherein the coating has a thickness of about 3 nanometers to about 8 micrometers.

9. The method of claim 8, wherein the coating has a thickness of about 10 nanometers to about 500 nanometers.

10. The method of claim 1, wherein the post treatment comprises thermally treating the coating.

11. The method of claim 1, wherein the post treatment comprises exposing the coating to an oxidizing agent to oxidize the coating.

12. The method of claim 1, wherein the depositing the coating comprises applying a bias voltage within a range of about 1 volt to about 300 volts.

13. The method of claim 12, wherein the post-treatment comprises exposing the aluminum substrate to an ozone plasma.

14. The method of claim 1, wherein the post-treatment process oxidizes about 200 nanometers or less of the coating.

15. A method of depositing a material on a substrate, comprising:
 positioning an aluminum substrate having one or more plenums formed therein in a container comprising an anode comprising an aluminum alloy, an electroplating bath, and a divider separating the anode and the aluminum substrate, the divider comprising a perforated PVDF sheet, the electroplating bath comprising a non-aqueous solvent and a deposition precursor, the deposition precursor comprising $Al(NO_3)_3$;
 depositing a coating on the aluminum substrate, the coating comprising aluminum or aluminum oxide;
 removing excess plating solution from the aluminum substrate, wherein the removing comprises washing and drying the aluminum substrate; and
 post-treating the aluminum substrate having the coating thereon.

16. The method of claim 15, wherein the post-treating comprises exposing the aluminum substrate to an ozone plasma.

17. The method of claim 15, wherein the post-treating comprises oxidizing the coating.

18. A method of depositing a material on a substrate, comprising:
 positioning an aluminum substrate having one or more plenums formed therein in a container comprising an anode comprising an aluminum alloy, an electroplating bath, and a divider separating the anode and the aluminum substrate, the divider comprising a perforated PVDF sheet, the electroplating bath comprising a non-aqueous solvent, a deposition precursor, and one or more additives selected from the group consisting of sulphonamide, and tetrabutyl ammonium hexafluorophosphate;
 depositing a coating on the aluminum substrate, the coating comprising aluminum or aluminum oxide;
 removing excess plating solution form the aluminum substrate; and
 post-treating the aluminum substrate having the coating thereon.

19. The method of claim 18, wherein the deposition precursor comprises $Al(NO_3)_3$.

* * * * *